United States Patent
Wieler et al.

(10) Patent No.: US 7,619,499 B2
(45) Date of Patent: Nov. 17, 2009

(54) SWITCHING UNIT HAVING A LOCKING FUNCTION FOR A TOOL

(75) Inventors: Michael Wieler, Schorndorf (DE); Jürgen Kurz, Mutlangen (DE); Jürg Schneider, Fichtenberg (DE)

(73) Assignee: Bosch Rexroth AG, Stuttgart (DE)

( * ) Notice: Subject to any disclaimer, the term of this patent is extended or adjusted under 35 U.S.C. 154(b) by 205 days.

(21) Appl. No.: 10/571,710

(22) PCT Filed: Aug. 6, 2004

(86) PCT No.: PCT/EP2004/008858

§ 371 (c)(1),
(2), (4) Date: Jan. 16, 2007

(87) PCT Pub. No.: WO2005/041229

PCT Pub. Date: May 6, 2005

(65) Prior Publication Data

US 2007/0108029 A1    May 17, 2007

(30) Foreign Application Priority Data

Sep. 23, 2003 (DE) .............................. 103 44 250

(51) Int. Cl.
    *H01F 7/20* (2006.01)
(52) U.S. Cl. ...................... 335/285; 335/229; 269/8
(58) Field of Classification Search ......... 335/285–289, 335/220–229; 269/8
    See application file for complete search history.

(56) References Cited

U.S. PATENT DOCUMENTS

| 3,407,370 | A |   | 10/1968 | Fast et al. |
| 5,757,180 | A | * | 5/1998  | Chou et al. ............... 324/207.2 |
| 6,003,367 | A |   | 12/1999 | Bux et al. |
| 6,501,357 | B2| * | 12/2002 | Petro ......................... 335/229 |
| 6,700,229 | B2| * | 3/2004  | Sadarangani et al. .......... 310/12 |
| 2002/0056321 | A1 |   | 5/2002 | Fallak |
| 2004/0095218 | A1 | * | 5/2004 | Wan et al. ................... 335/207 |

FOREIGN PATENT DOCUMENTS

| DE | 197 49 330 | 5/1999 |
| DE | 202 20 379 | 7/2003 |

* cited by examiner

*Primary Examiner*—Elvin G Enad
*Assistant Examiner*—Bernard Rojas
(74) *Attorney, Agent, or Firm*—Kenyon & Kenyon LLP

(57) ABSTRACT

A switch unit having a combined switch function and locking function for controlling industrial tools, both the locking function and the switch function being achieved magnetically.

3 Claims, 3 Drawing Sheets

SWITCHING UNIT HAVING A LOCKING FUNCTION FOR A TOOL

FIELD OF THE INVENTION

The present invention relates to a switch unit having a combined switching and locking function for controlling industrial tools, especially hand-held units, such as screwdrivers and drills.

BACKGROUND INFORMATION

Requirements on the performance of industrial tools are becoming ever greater, and the ratio of cost to benefit is especially being observed ever more critically. In all industries, the overall costs of production units are considered, and not only the acquisition price: the maintenance effort, replacement parts cost, failure rate, etc., in sum determine the service life costs of the unit. Naturally, productivity also plays a major role. Units that people like to use and that are easy to operate contribute to an increased productivity. For this reason, the user friendliness of a unit is an important differentiating feature for the suppliers of industrial tools. The actuating elements of a device are of greater meaning because they are often operated/used. An electrical or mechanical fault in such a small part can bring the unit to a standstill. The actuating elements (or switch units), among them switches, buttons and/or rotating or sliding elements have to be robust, easy to handle, able to be set in a clear manner and resistant to wear, to the greatest extent possible.

In units that are now on the market, actuating elements, such as switches and rotating knobs are furnished with a mechanical click point torque, in order to improve the operability and the unambiguity of the switching. The click point torque is generated by frictional elements or spring elements, as a rule, and the electrical switching function is implemented by an electromechanical switch. The service life of this type of actuating elements is limited by its mechanical properties, and its wear leads to a reduction in the MTBF (mean time between failures) of the unit.

SUMMARY OF THE INVENTION

Thus, the present invention is based on the object of making available an improved switch unit having combined switch function and locking function for controlling industrial tools, and at the same time, of avoiding the disadvantages of the usual design approaches. According to the present invention, these objects are attained by the switch unit. The switch unit having a combined switch function and locking function for controlling industrial tools has both a locking function and a switch function, both functions taking place on a magnetic basis. The switch unit is made up of two opposite rows of magnets, and each row is made up of at least two magnets. The distance between the enveloping magnet rows lying on opposite sides is essentially constant, the rows being relatively movable with respect to one another in the direction of the extension of the rows. Furthermore, the distance between the adjacent magnets of one row is essentially constant, and in one of the rows of magnets at least one magnetic field detector is provided. Consequently, the switch unit is almost free from wear, its properties are not time dependent, and the maintenance intervals provided for it are only dependent on the support of the rotary knob. Therefore, the switch unit is very robust.

In one row of magnets a magnetic field detector is provided, the detector replacing one magnet of a series and having two adjacent magnets. Moreover, the distance between the detector and each of the two magnets is approximately equivalent to the distance, or a multiple of the distance, between the magnets mounted in the opposite row. The magnets adjacent to the detector are mounted in such a way that the opposite sides have different magnetic poles. Conditional upon the simple geometry of the magnet rows, the advantages of this type of construction are that the magnets perform both locking functions and switch functions. This type of construction has the advantage that the magnet, whose magnetic field is detected by the detector, always lies directly opposite to the detector in the locked-in state. Thus the geometry ensures a consistent and reliable behavior of the switch unit. Advantageously, the magnets are also situated (magnetized) in such a way that a closed magnetic flux circuit is present independently of the setting of the switch unit, that is, the stray flux is minimized.

A Hall effect sensor is advantageously used as the detector, because it is not prone to wear, and may be constructed to be very small. For this reason, based on the type of construction, the detector is very flexible. It is also available as a standard product, and gives off a 1-bit output signal, which permits setting the rotary direction of a hand unit without adjustment or complicated signal processing.

In one additional advantageous specific embodiment, the switch unit is a rotary switch which has two switching states that correspond to two rotary directions of a hand unit. In order to keep the switch unit compact, and to increase the efficiency of the magnets, the magnets should be furnished with a ferromagnetic shield at their sides facing away from each other. This shield minimizes the stray flux losses, and thereby increases the effective magnetic flux of the circuit.

DETAILED DESCRIPTION

Figure 1:
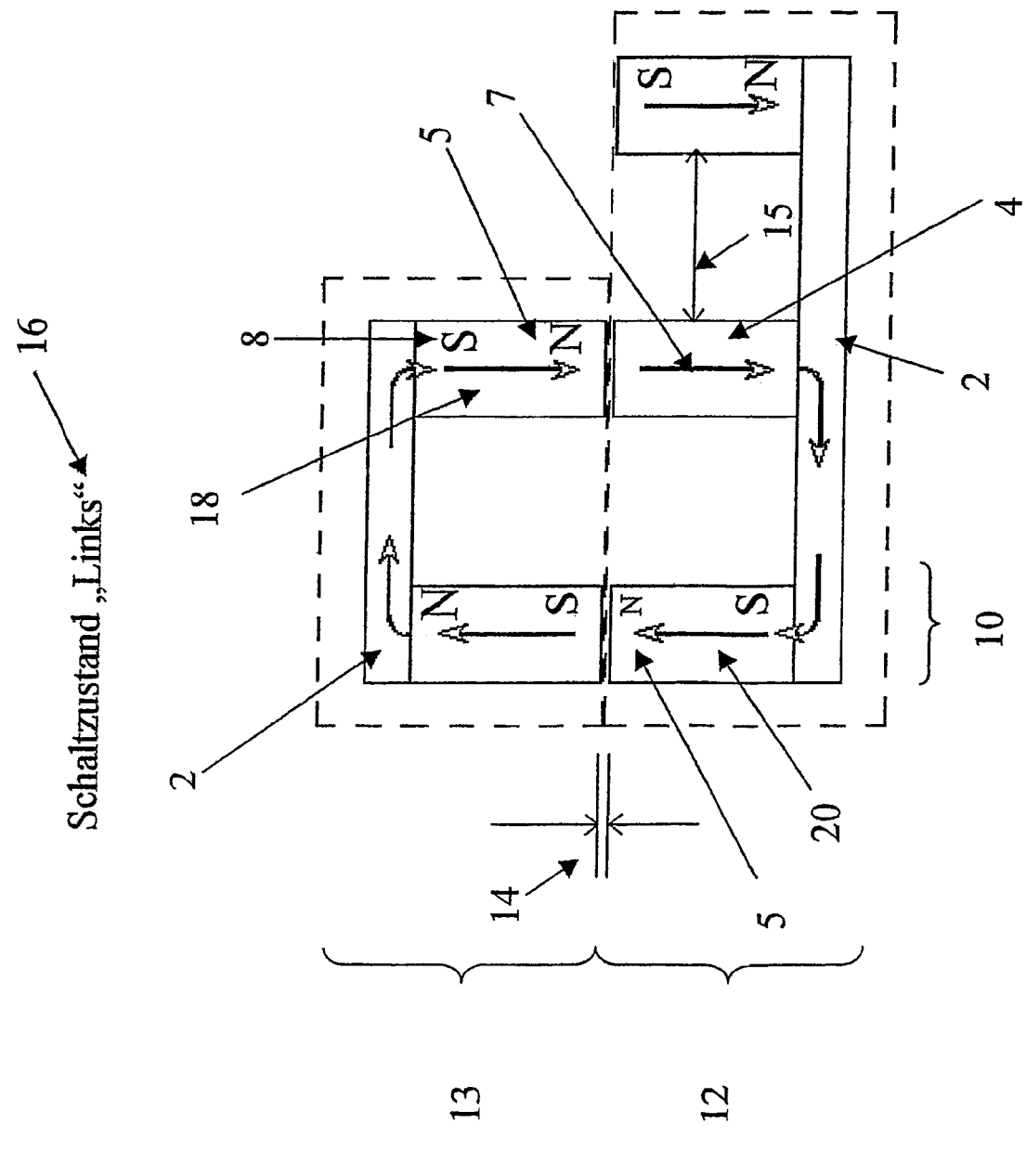
FIG. 1 shows a schematic representation of the switching state "left" of a switch unit according to the present invention.

Similar or similarly functioning components are characterized in the figures by the same reference numerals, to a great extent.

Figure 2:
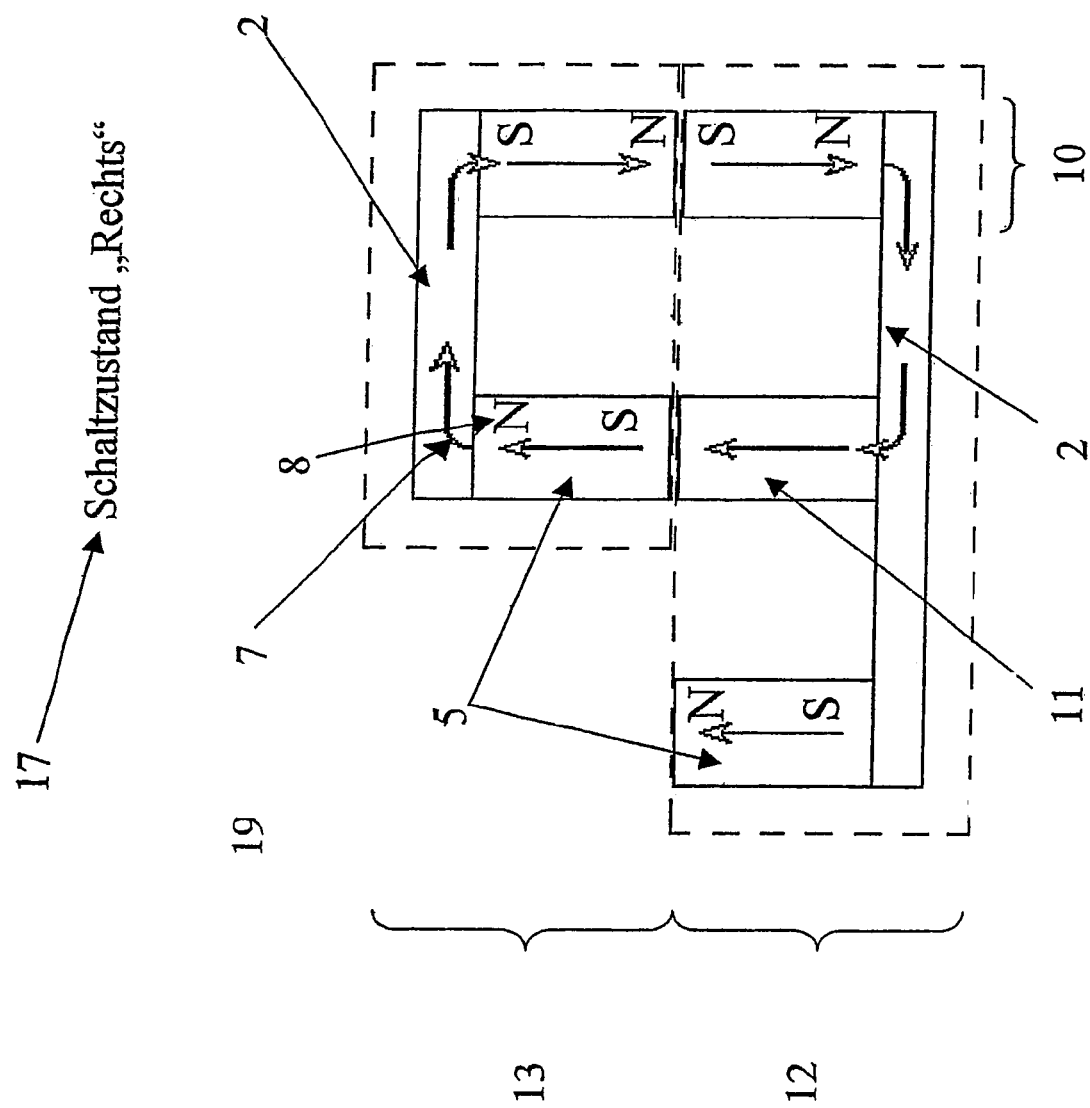
FIG. 2 shows a schematic representation of the switching state "right" of a switch unit according to the present invention.
Figure 3:
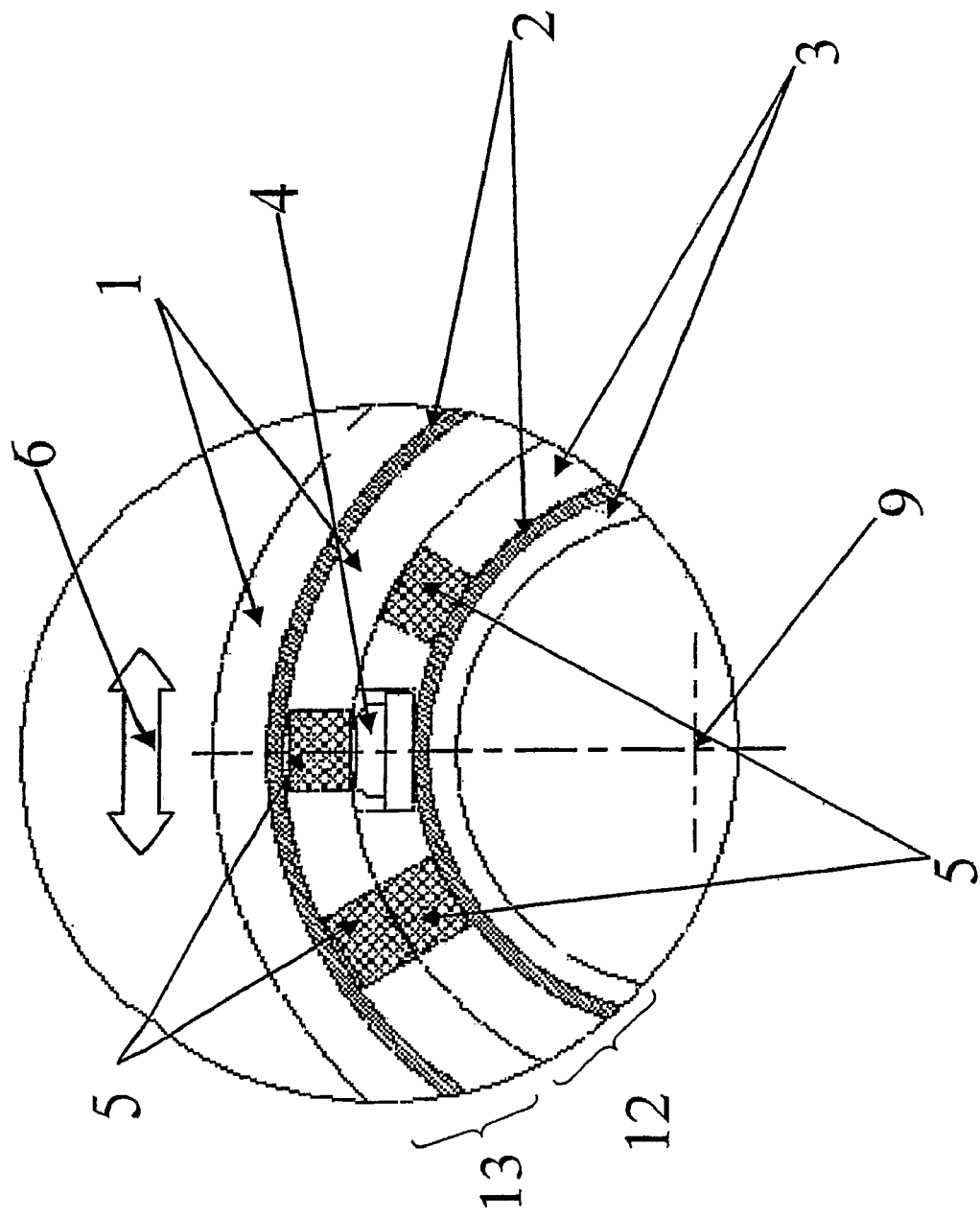
FIG. 3 shows a cross section of a rotary switch according to the present invention.

FIGS. 1, 2 and 3 show schematic representations of preferred forms of the present invention. FIGS. 1 and 2 show a magnetic circuit including two rows of magnets 12, 13, two ferromagnetic steel rings 2 assigned to the magnets, and a detector 4, 11. According to the present invention, the row of magnets 13 is relatively movable with respect to row 12, that is, row 12 is mounted in a fixed manner, whereas row 13 is able to be shifted in a left or right direction. The distance between the row 14 is also mechanically fixed, according to the present invention. However, the type and method of fixing is not shown in schematic FIGS. 1 and 2, and depends on the specific embodiment of the switch unit.

According to the present invention, detector 4, 11 always has to have a magnet 18 lying opposite to it, This results in the circuit only being able to assume two states, as shown. The two states are designated in the figures as "left" 16 and "right" 17. If movable row 13 is designated as the active row, then two magnets 18, 19 are active and take a part in the circuit/locking. In FIG. 1, all magnets 5 taking part in the magnetic circuit are situated as follows. Magnetic flux 7 from magnet row 13 flows through detector 4, through steel ring 2, through magnet 20 and back again to opposite row 13. The direction of the flux is detected by Hall sensor 4 and the output of the sensor is switched to the corresponding state. The very high permeability of ferromagnetic steel ring 2 takes care that almost the entire flux 7 flows through detector 4 and simultaneously screens the detector against external magnetic stray flux.

The two locked-in magnets 19, 20 take care that the position of magnet 18, which switches the detector, of movable row of magnets 13, remains constant under normal working conditions with reference to opposite row 12, that is, that the vibrations and impacts to be expected during operation do not influence the state of the sensor output. If row of magnets 13 is shifted with respect to row 12, for instance, from left 16 to right 17, then the force has to be sufficient to overcome the click point torque of locked-in magnets 19. As soon as the click point torque is overcome, row of magnets 13 may be moved to the right using minimum effort, until the two magnets 19 attract each other and lock in. If row of magnets 13 is shifted into switching state "right" 17, the flux direction through the Hall sensor reverses direction, and because of that, the output of the sensor also switches over correspondingly. Ferrite magnets or occasionally geomagnets may be used, depending on the size of the switch, the click point torque required and the desired price/performance ratio.

FIG. 3 shows a cutout of the cross section of a rotary switch. The rotary switch has an axis of rotation 9, a fixed row of magnets 12 and a rotatable row of magnets 13. Switch rings 1 and base body 3 are made of a nonferromagnetic substance. Ferromagnetic steel rings 2 are incorporated into switch ring and base body 3. The substance acts like air with regard to magnetic flux 7 and holds magnets 5 and detector 4 mechanically in a fixed position, without influencing the magnetic flux.

Row 13 can be turned left or right with respect to row 12. The state shown in FIG. 3 corresponds to switch state "left" 16 shown in FIG. 2. The detector of the rotary switch shown in FIG. 3 has two output states which correspond to switch states left 16 and right 17. If the rotary switch is used as a control element of a hand tool, for instance, of a screwdriver or a drill, then the two states could correspond to the two rotary directions of the hand too.

There is a possibility of operating the detector as an analog sensor, that is, to position the magnets in such a way that the rotary angle of the rotary switch is able to be recorded. The detector output is then evaluated as the analog signal.

LIST OF REFERENCE NUMERALS 1. switch ring
2. ferromagnetic steel rings
3. base body
4. magnetic field detector
5. magnets
6. rotary direction
7. magnetic flux
8. magnetic poling
9. rotary axis
10. locked-in state
11. magnetic field sensor
12. row of magnets (passive)
13. row of magnets (active)
14. opposite sides
15. distance apart of the magnets
16. switching state left
17. switching state right
18. switching magnets
19. locked-in magnet
20. locked-in magnet

What is claimed is:

1. A switch unit for providing a combined switching and locking function for controlling an industrial tool, both the locking function and the switching function taking place on a magnetic basis, the switch unit comprising:
    two facing rows of magnets, wherein:
        each magnet row is made up of at least two magnets,
        a width of a gap between facing sides of the magnet rows is essentially constant,
        the magnet rows are relatively movable with respect to each other in a direction of an extension of the magnet rows, and
        a distance between adjacent magnets one of the magnet rows is essentially constant; and
        at least one magnetic field detector provided in at least one of the magnet rows;
    wherein the at least one magnetic field detector replaces a magnet in a sequence and has two adjacent magnets,
    wherein the at least one magnetic field detector includes a Hall effect sensor,
    wherein a distance between the at least one magnetic detector and each of the magnets of the two magnet rows corresponds approximately to one of a distance and an integral multiple of the distance between the magnets mounted in the facing magnet rows, and the magnets adjacent to the at least one magnetic detector are mounted so that the facing sides have different magnetic poles,
    wherein the facing magnets are situated so that the switch unit has two stable mechanical locked-in states, in one of the locked-in states always the facing side of a magnet directly facing the at least one magnetic detector and being detected by the at least one magnetic detector, and
    wherein:
    the at least one magnetic detector includes two adjacent magnets,
    a row of magnets facing the at least one magnetic detector has only two magnets,
    the sides facing each other of the magnets of each row of magnets correspond to different magnetic poles, and
    a sequence of the magnetic poles of the two rows is opposite, as seen in the extension of the rows, so that in every locking setting two magnets having different poles face each other and execute the locking function, and in different locking settings, in each case different magnetic poles face the at least one magnetic field detector.

2. A switch unit for providing a combined switching and locking function for controlling an industrial tool, both the locking function and the switching function taking place on a magnetic basis, the switch unit comprising:
    two facing rows of magnets, wherein each magnet row is made up of at least two magnets, a width of a gap between facing sides of the magnet rows is essentially constant, the magnet rows are relatively movable with respect to each other in a direction of an extension of the magnet rows, and a distance between adjacent magnets one of the magnet rows is essentially constant; and
    at least one magnetic field detector provided in at least one of the magnet rows;
    wherein a sequence of the magnetic poles of two magnet rows is opposite, as seen in an extension of the rows, so that in every locking setting two magnets having different poles face each other and execute the locking function, and in different locking settings, in each case different magnetic poles face the at least one magnetic field detector, and wherein the switch unit is a rotary switch for setting a rotary direction of the tool.

3. A switch unit for providing a combined switching and locking function for controlling an industrial tool, both the locking function and the switching function taking place on a magnetic basis, the switch unit comprising:

two facing rows of magnets, wherein each magnet row is made up of at least two magnets, a width of a gap between facing sides of the magnet rows is essentially constant, the magnet rows are relatively movable with respect to each other in a direction of an extension of the magnet rows, and a distance between adjacent magnets one of the magnet rows is essentially constant; and at least one magnetic field detector provided in at least one of the magnet rows;

wherein a sequence of the magnetic poles of two magnet rows is opposite, as seen in an extension of the rows, so that in every locking setting two magnets having different poles face each other and execute the locking function, and in different locking settings, in each case different magnetic poles face the at least one magnetic field detector, and wherein the at least one magnetic detector includes two adjacent magnets, a row of magnets facing the at least one magnetic detector has only two magnets, and the sides facing each other of the magnets of each row of magnets correspond to different magnetic poles.

* * * * *

UNITED STATES PATENT AND TRADEMARK OFFICE
CERTIFICATE OF CORRECTION

PATENT NO. : 7,619,499 B2  Page 1 of 1
APPLICATION NO. : 10/571710
DATED : November 17, 2009
INVENTOR(S) : Wieler et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 444 days.

Signed and Sealed this

Twenty-sixth Day of October, 2010

David J. Kappos
*Director of the United States Patent and Trademark Office*